US010242135B2

(12) United States Patent
Joshi et al.

(10) Patent No.: US 10,242,135 B2
(45) Date of Patent: Mar. 26, 2019

(54) TESTBENCH CHAINING FOR MULTIPLE BLOCKS IN HIERARCHICAL CIRCUIT DESIGN

(71) Applicant: Synopsys, Inc., Mountain View, CA (US)

(72) Inventors: Gajanan Madhukarrao Joshi, Pune (IN); Jonathan Lee Sanders, Santa Clara, CA (US); Donald John Oriordan, Sunnyvale, CA (US); Ruben Grigoryan, Yerevan (AM); Hui Xu, Milton (CA)

(73) Assignee: Synopsys, Inc., Mountain View, CA (US)

( * ) Notice: Subject to any disclaimer, the term of this patent is extended or adjusted under 35 U.S.C. 154(b) by 168 days.

(21) Appl. No.: 15/442,480

(22) Filed: Feb. 24, 2017

(65) Prior Publication Data

US 2017/0249411 A1 Aug. 31, 2017

Related U.S. Application Data

(60) Provisional application No. 62/299,970, filed on Feb. 25, 2016.

(51) Int. Cl.
*G06F 17/50* (2006.01)

(52) U.S. Cl.
CPC ........ *G06F 17/5036* (2013.01); *G06F 17/504* (2013.01); *G06F 17/505* (2013.01)

(58) Field of Classification Search
CPC ... G06F 17/5036; G06F 17/505; G06F 17/504
See application file for complete search history.

(56) References Cited

U.S. PATENT DOCUMENTS 6,721,922 B1 * 4/2004 Walters ............... G06F 17/5022 716/102
7,822,590 B2 * 10/2010 Kundert ........... G01R 31/31835 345/581
8,856,190 B2 * 10/2014 Grechanik ........ G06F 17/30908 707/802

* cited by examiner

*Primary Examiner* — Naum Levin
(74) *Attorney, Agent, or Firm* — Fenwick & West LLP

(57) ABSTRACT

A selection of a source testbench is received from a user. The source testbench includes a description of one or more source parameters, a description of one or more source measurements, and a plurality of source entries, each of the source entries including a value for each of the one or more source parameters and each of the one or more source measurements. Furthermore, a selection of a destination testbench is received. The destination testbench includes a description of one or more destination parameters and a plurality of destination entries including a value for each of the one or more destination parameters. One or more source entries are matched with a destination entry. One or more source measurements of the matched one or more source entries are aggregated based on an aggregation function, and the aggregated source measurements are mapped to the matched source entry.

20 Claims, 10 Drawing Sheets

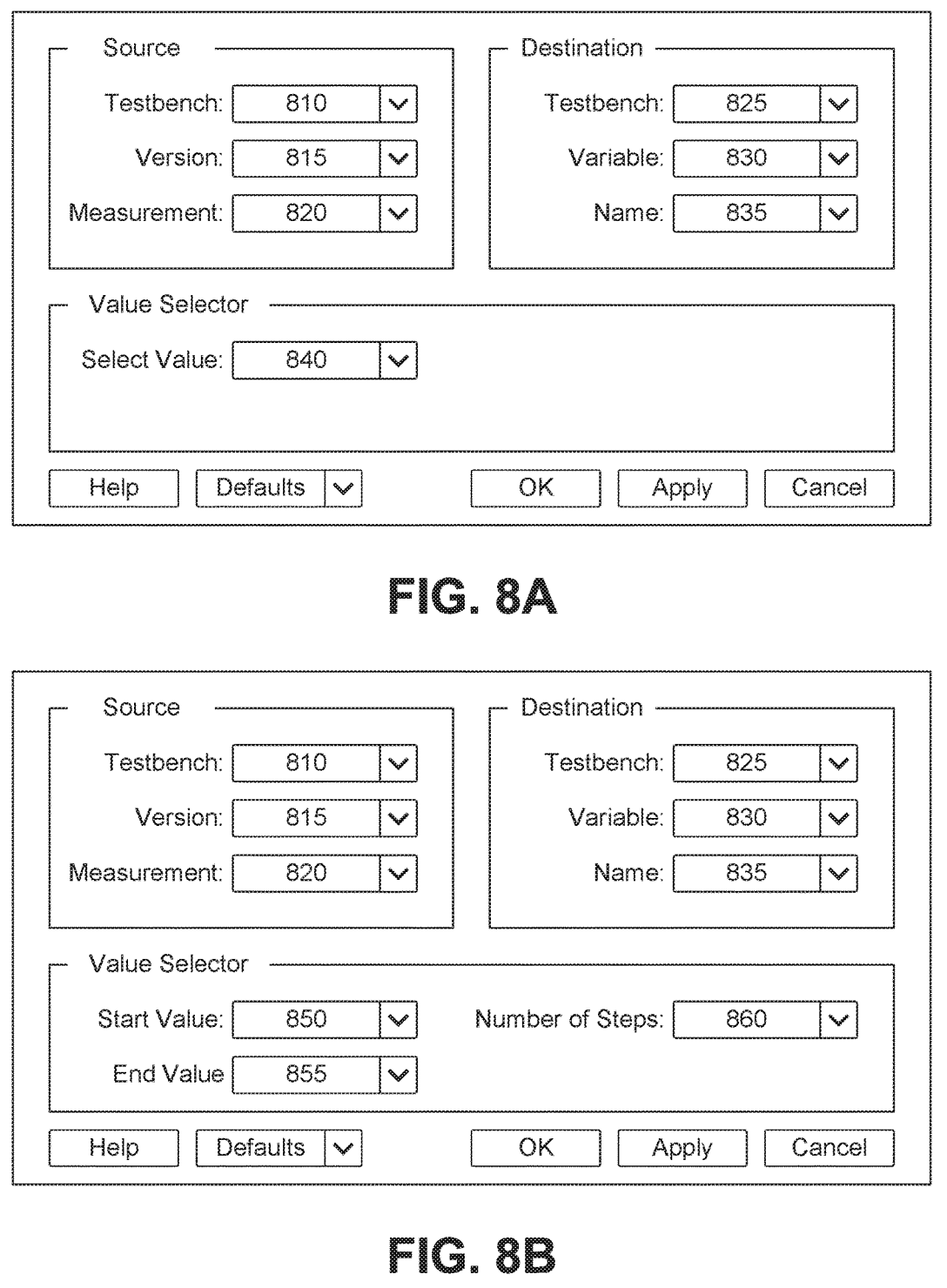

Source
Testbench: 810
Version: 815
Measurement: 820

Destination
Testbench: 825
Variable: 830
Name: 835

Value Selector
Select Value: 840

Help Defaults OK Apply Cancel

FIG. 8A

Source
Testbench: 810
Version: 815
Measurement: 820

Destination
Testbench: 825
Variable: 830
Name: 835

Value Selector
Start Value: 850
Number of Steps: 860
End Value 855

Help Defaults OK Apply Cancel

TESTBENCH CHAINING FOR MULTIPLE BLOCKS IN HIERARCHICAL CIRCUIT DESIGN

CROSS REFERENCE TO RELATED APPLICATIONS

This application claims the benefit of U.S. Provisional Application No. 62/299,970, filed on Feb. 25, 2016, which is incorporated by reference herein in its entirety.

BACKGROUND

1. Field of Art

The disclosure generally relates to the field of simulation and verification of a circuit design and more specifically to adapting a testbench of a downstream module to be compatible with a current module under test.

2. Description of the Related Art

In the design of custom integrated circuits, a design is oftentimes hierarchically subdivided into various blocks. The outputs of one block may be used as the input for another block. Furthermore, a target performance is then specified for each of the blocks of the design of the custom integrated circuit. In the design of a larger integrated circuit, the different blocks may be assigned to different design engineers. In this scenario, the design of some blocks may become complete before others. Moreover, different blocks may have different sensitivities to various process, voltage, temperature, and load variations, leading to different verification strategies.

During the design of a downstream block, the designer may make certain assumptions on the variation for the inputs of the block, which correspond to variation in the upstream blocks. The designer of the downstream block may then design the block based on those assumptions. After the upstream blocks are finalized, the designer of the downstream block may verify the performance of the block based on the actual performance of the upstream block. That is, the downstream block may be verified using the simulation results of the upstream blocks.

However, the verification of the downstream block is oftentimes difficult to achieve due to each block being designed by separate engineers, often in separate geographical locations, and verified under different set of corner condition for process and environment as a result of the differing verification strategies. For example, some blocks are verified under a wide range of temperatures and a narrow range of power supply voltages, while other are verified under a narrow range of temperature and a wide range of power supply voltages. Furthermore, measurements and variables names may differ from block to block. As such, this may create data access and data alignment problems that complicate the verification of the custom integrated circuit.

SUMMARY

Embodiments relate to chaining a testbench of a source block and a testbench of a destination block in the simulation and/or verification of a hierarchical circuit design. The output measurements of one or more source blocks are aggregated and mapped to input values of a destination block.

In one embodiment, a source testbench includes a description of one or more source parameters for the testing of a source circuit block, a description of one or more source measurements from the testing of the source circuit block, and a plurality of source entries. Each of the source entries includes a value for each of the one or more source parameters and each of the one or more source measurements. Furthermore, a selection of a destination testbench is received. The destination testbench includes a description of one or more destination parameters and a plurality of destination entries includes a value for each of the one or more destination parameters. One or more source entries from the plurality of source entries are matched with a destination entry from the plurality of destination entries. The matching of the source entries and the destination entries is performed based on the value of the one or more source parameters of each of the source entries and the value of the one or more destination parameters of each of the destination entries. One or more source measurements of the matched one or more source entries are aggregated based on an aggregation function, and the aggregated source measurements are mapped to the matched source entry.

BRIEF DESCRIPTION OF DRAWINGS

The disclosed embodiments have other advantages and features which will be more readily apparent from the detailed description, the appended claims, and the accompanying figures (or drawings) as set forth below:

FIGS. 8A, 8B, and 8C illustrate graphical user interfaces for configuring the source and destination testbench mapping, according to one embodiment.

DETAILED DESCRIPTION

The Figures (FIGS.) and the following description relate to preferred embodiments by way of illustration only. It should be noted that from the following discussion, alternative embodiments of the structures and methods disclosed herein will be readily recognized as viable alternatives that may be employed without departing from the principles of what is claimed.

Reference will now be made in detail to several embodiments, examples of which are illustrated in the accompanying figures. It is noted that wherever practicable similar or like reference numbers may be used in the figures and may indicate similar or like functionality. The figures depict embodiments of the disclosed system (or method) for purposes of illustration only. One skilled in the art will readily recognize from the following description that alternative embodiments of the structures and methods illustrated herein may be employed without departing from the principles described herein.

Computing Machine Architecture

Figure 1:
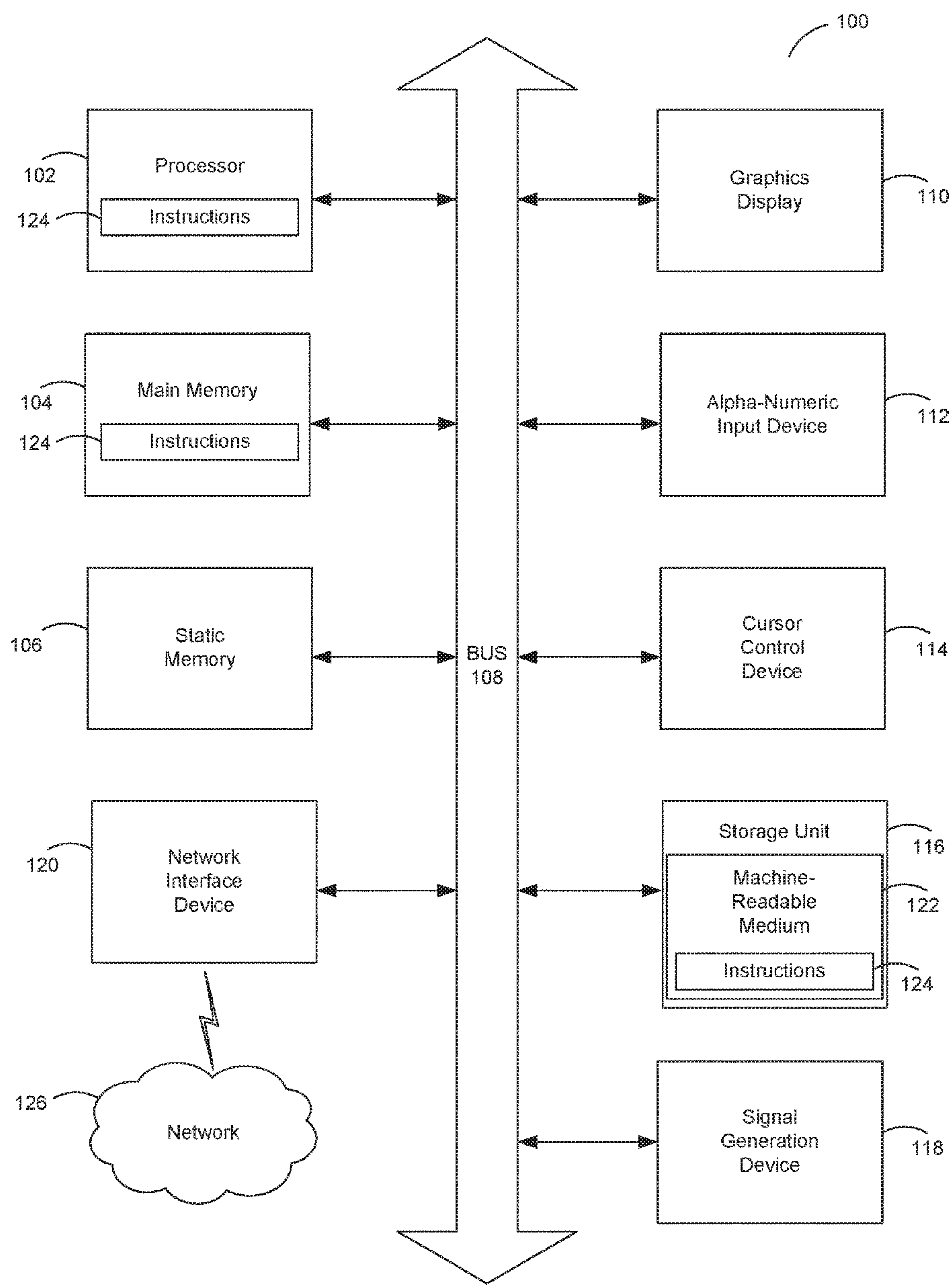
FIG. 1 illustrates components of an example machine that reads instructions from a machine-readable medium and execute them in a processor (or controller), according to one embodiment.

FIG. (FIG. 1 is a block diagram illustrating components of an example machine able to read instructions from a machine-readable medium and execute them in a processor (or controller). Specifically, FIG. 1 shows a diagrammatic representation of a machine in the example form of a computer system 100 within which instructions 124 (e.g., software) for causing the machine to perform any one or more of the methodologies discussed herein may be executed. In alternative embodiments, the machine operates as a standalone device or may be connected (e.g., networked) to other machines. In a networked deployment, the machine may operate in the capacity of a server machine or a client machine in a server-client network environment, or as a peer machine in a peer-to-peer (or distributed) network environment.

The machine may be a server computer, a client computer, a personal computer (PC), a tablet PC, a set-top box (STB), a personal digital assistant (PDA), a cellular telephone, a smartphone, a web appliance, a network router, switch or bridge, or any machine capable of executing instructions 124 (sequential or otherwise) that specify actions to be taken by that machine. Further, while only a single machine is illustrated, the term "machine" shall also be taken to include any collection of machines that individually or jointly execute instructions 124 to perform any one or more of the methodologies discussed herein.

The example computer system 100 includes a processor 102 (e.g., a central processing unit (CPU), a graphics processing unit (GPU), a digital signal processor (DSP), one or more application specific integrated circuits (ASICs), one or more radio-frequency integrated circuits (RFICs), or any combination of these), a main memory 104, and a static memory 106, which are configured to communicate with each other via a bus 108. The computer system 100 may further include graphics display unit 110 (e.g., a plasma display panel (PDP), a liquid crystal display (LCD), a projector, or a cathode ray tube (CRT)). The computer system 100 may also include alphanumeric input device 112 (e.g., a keyboard), a cursor control device 114 (e.g., a mouse, a trackball, a joystick, a motion sensor, or other pointing instrument), a storage unit 116, a signal generation device 118 (e.g., a speaker), and a network interface device 820, which also are configured to communicate via the bus 108.

The storage unit 116 includes a machine-readable medium 122 on which is stored instructions 124 (e.g., software) embodying any one or more of the methodologies or functions described herein. The instructions 124 (e.g., software) may also reside, completely or at least partially, within the main memory 104 or within the processor 102 (e.g., within a processor's cache memory) during execution thereof by the computer system 100, the main memory 104 and the processor 102 also constituting machine-readable media. The instructions 124 (e.g., software) may be transmitted or received over a network 126 via the network interface device 120.

While machine-readable medium 122 is shown in an example embodiment to be a single medium, the term "machine-readable medium" should be taken to include a single medium or multiple media (e.g., a centralized or distributed database, or associated caches and servers) able to store instructions (e.g., instructions 124). The term "machine-readable medium" shall also be taken to include any medium that is capable of storing instructions (e.g., instructions 124) for execution by the machine and that cause the machine to perform any one or more of the methodologies disclosed herein. The term "machine-readable medium" includes, but not be limited to, data repositories in the form of solid-state memories, optical media, and magnetic media.

Overview of EDA Design Flow

Figure 2:
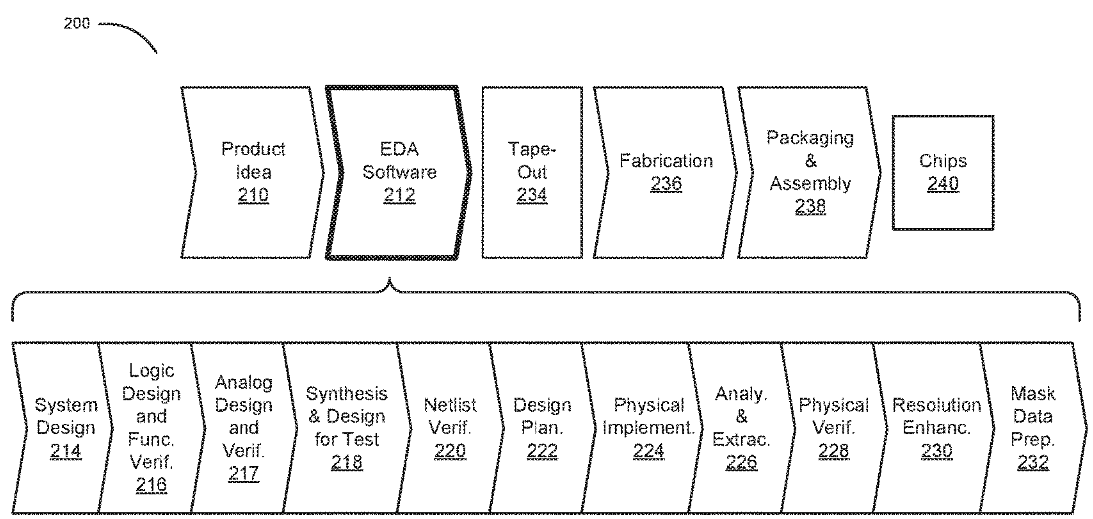
FIG. 2 illustrates a flowchart illustrating various operations in the design and fabrication of an integrated circuit, according to one embodiment.

FIG. 2 is a flowchart 200 illustrating the various operations in the design and fabrication of an integrated circuit. This process starts with the generation of a product idea 210, which is realized during a design process that uses electronic design automation (EDA) software 212. When the design is finalized, it can be taped-out 234. After tape-out, a semiconductor die is fabricated 236 to form the various objects (e.g., gates, metal layers, vias) in the integrated circuit design. Packaging and assembly processes 238 are performed, which result in finished chips 240.

The EDA software 212 may be implemented in one or more computing devices such as the computer 100 of FIG. 1. For example, the EDA software 212 is stored as instructions in the computer-readable medium which are executed by a processor for performing operations 214-232 of the design flow, which are described below. This design flow description is for illustration purposes. In particular, this description is not meant to limit the present disclosure. For example, an actual integrated circuit design may require a designer to perform the design operations in a difference sequence than the sequence described herein.

During system design 214, designers describe the functionality to implement. They can also perform what-if planning to refine the functionality and to check costs. Note that hardware-software architecture partitioning can occur at this stage. Example EDA software products from Synopsys, Inc. of Mountain View, Calif. that can be used at this stage include: Model Architect®, Saber®, System Studio®, and Designware® products.

During logic design and functional verification 216, VHDL or Verilog code for modules in the circuit is written and the design is checked for functional accuracy. More specifically, the design is checked to ensure that it produces the correct outputs. Example EDA software products from Synopsys, Inc. of Mountain View, Calif. that can be used at this stage include: VCS®, Vera®, 10 Designware®, Magellan®, Formality®, ESP® and Leda® products.

During analog design, layout, and simulation 217, analog circuits are designed, laid out, and simulated to ensure both functionality and performance. Example EDA software products from Synopsys, Inc. of Mountain View, Calif. that can be used at this stage include: Custom Compiler®, Hspice®, HspiceRF®, XA®, Nanosim®, HSim®, and Finesim® products.

During synthesis and design for test 218, VHDL/Verilog is translated to a netlist. This netlist can be optimized for the target technology. Additionally, tests can be designed and implemented to check the finished chips. Example EDA software products from Synopsys, Inc. of Mountain View, Calif. that can be used at this stage include: Design Compiler®, Physical Compiler®, Test Compiler®, Power Compiler®, FPGA Compiler®, Tetramax®, and Designware® products.

During netlist verification 220, the netlist is checked for compliance with timing constraints and for correspondence with the VHDL/Verilog source code. Example EDA software products from Synopsys, Inc. of Mountain View, Calif. that can be used at this stage include: Formality®, PrimeTime®, and VCS® products.

During design planning 222, an overall floor plan for the chip is constructed and analyzed for timing and top-level routing. Example EDA software products from Synopsys, Inc. of Mountain View, Calif. that can be used at this stage include: Astro® and IC Compiler® products.

During physical implementation 224, the placement (positioning of circuit elements) and routing (connection of the same) occurs. Example EDA software products from Synopsys, Inc. of Mountain View, Calif. that can be used at this stage include: the Custom Compiler®, Astro®, and IC Compiler® products.

During analysis and extraction 226, the circuit function is verified at a transistor level, which permits refinement. Example EDA software products from Synopsys, Inc. of Mountain View, Calif. that can be used at this stage include: Astrorail®, Primerail®, PrimeTime®, and Star RC/XT® products.

During physical verification 228, the design is checked to ensure correctness for: manufacturing, electrical issues, lithographic issues, and circuitry. Example EDA software products from Synopsys, Inc. of Mountain View, Calif. that can be used at this stage include the Hercules® and IC Validator product.

During resolution enhancement 230, geometric manipulations of the layout are performed to improve manufacturability of the design. Example EDA software products from Synopsys, Inc. of Mountain View, Calif. that can be used at this stage include: Proteus®, Proteus®AF, and PSMGED® products.

During mask-data preparation 232, the 'tape-out' data for production of masks to produce finished chips is provided. Example EDA software products from Synopsys, Inc. of Mountain View, Calif. that can be used at this stage include the CATS® family of products.

Embodiments of the present disclosure can be used during one or more of the above-described stages. Specifically, embodiments may be used for the processes of Analog Design and Verification 217 and physical implementation 224.

Circuit Simulation and Verification

Figure 3:
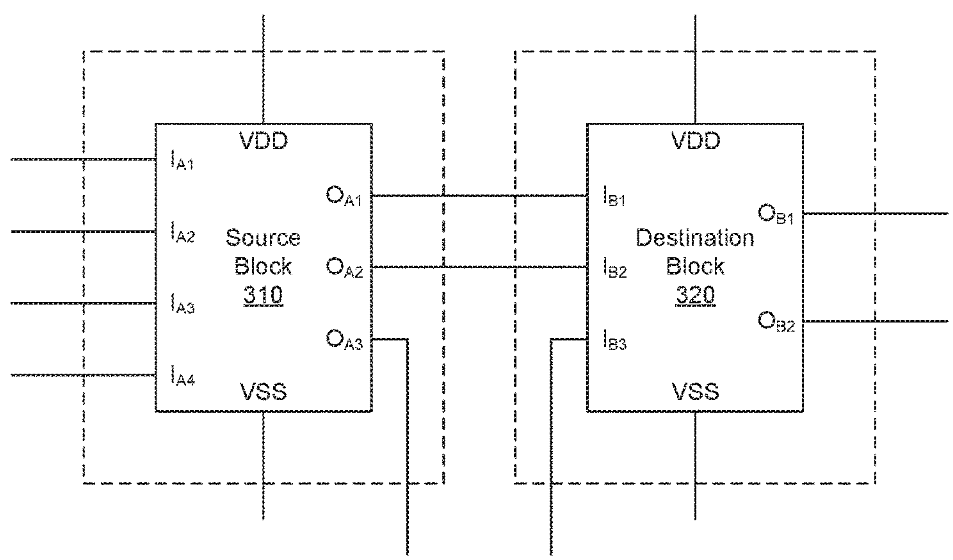
FIG. 3 illustrates an integrated circuit design including multiple circuit modules that are connected to each other, according to one embodiment.

FIG. 3 illustrates an integrated circuit design including multiple circuit modules that are connected to each other, according to one embodiment. The example circuit of FIG. 3 includes a source block 310 (upstream block) connected to a destination block 320 (block under test). The source block 310 may receive four input signals via input pins $I_{A1}$ through $I_{A4}$, two supply voltages VDD and VSS, and provides three output signals via output pins $O_{A1}$ through $O_{A3}$. The destination block 320 may receive three input signals via input pins $I_{B1}$ through $I_{B3}$, two supply voltages VDD and VSS, and provides two output signals via output pins $O_{B1}$ and $O_{B2}$. The first output pin $O_{A1}$ of the source block 310 is coupled to the first input pin $I_{B1}$ of the destination block 320, and the second output pin $O_{A2}$ of the source block 310 is coupled to the second input pin $I_{B1}$ of the destination block 320.

The source block 310 and the destination block 320 may be simulated or verified under different conditions. For instance, source block 310 may be sensitive to voltage variations, but not very sensitive to temperature variations. As such, source block 310 is tested for a large number of input voltages, but only for a limited number of temperature conditions. Alternatively, the destination block may not be very sensitive to voltage variations, but very sensitive to temperature variations. As such, the designer of the destination block may want to perform extensive tests with varying temperature conditions but not many voltage conditions. Since the temperature tests for the source block 310 were limited, the designer of the destination block 320 may not find available output results for the source block 310 to be provided to the destination block 320 as an input signal for the temperatures to be tested.

Figure 4:
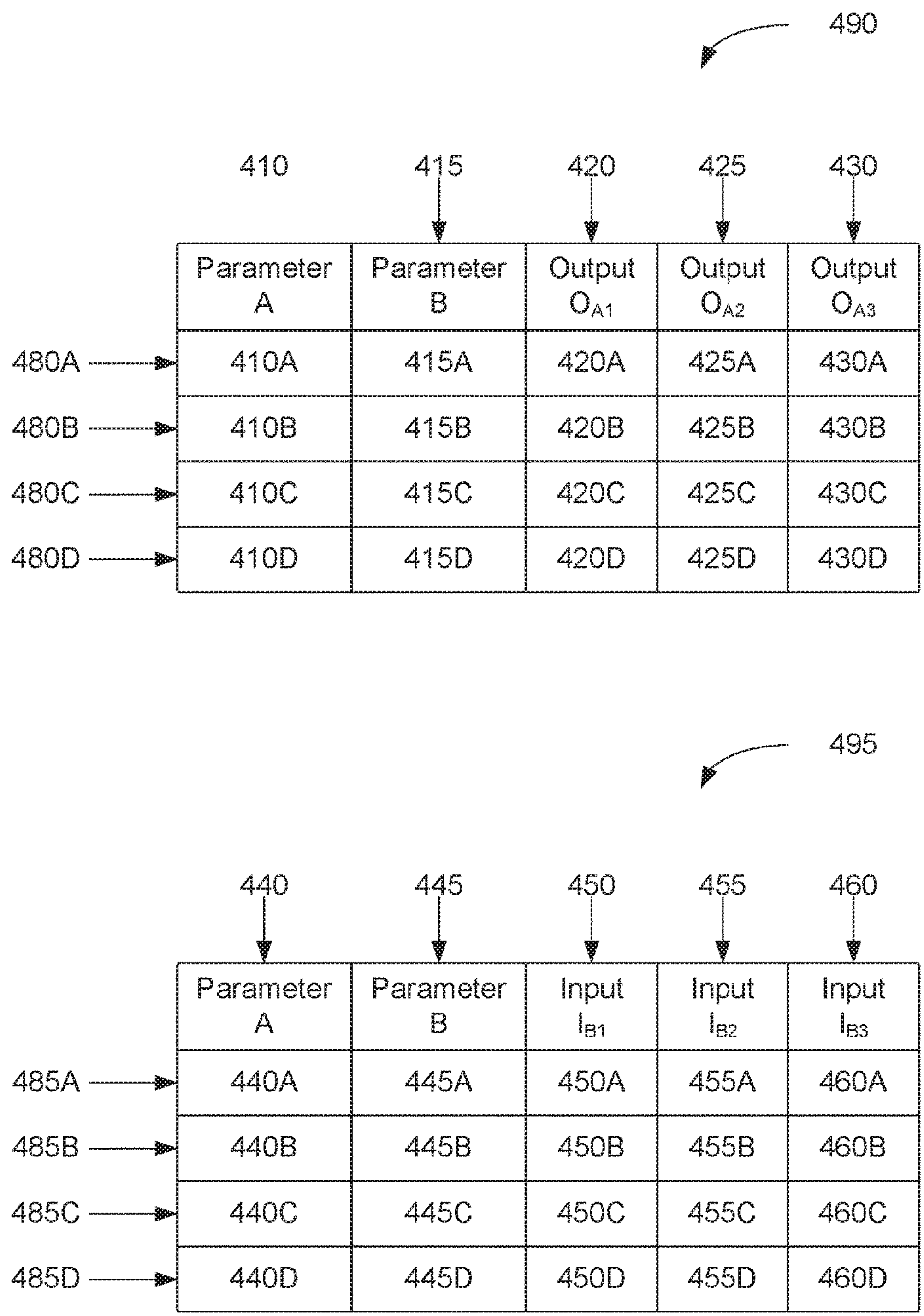
FIG. 4 illustrates tables for testbenches of a source block and a destination block of the integrated circuit design of FIG. 3, according to one embodiment.

FIG. 4 illustrates tables for testbenches of source block 310 and destination block 320 the integrated circuit design of FIG. 3, according to one embodiment. Table 490 shows a testbench used to test source block 310 and table 495 shows a testbench for testing destination block 320. The testbench for testing source blocks 310 and 320 have as inputs parameters A and B (e.g., temperature and output capacitance).

Table 490 includes four rows or entries 480A through 480D (source entries). Each entry 480A through 480D includes a value for parameter A and parameter B, as well as a value for measurements $O_{A1}$, $O_{A2}$, and $O_{A3}$. For example, entry 480A includes value 410A for parameter A, value 415A for parameter B, value 420A for measurement $O_{A1}$, value 425A for measurement $O_{A2}$, and value 430A for measurement $O_{A3}$. Entry 480B includes value 410B for parameter A, value 415B for parameter B, value 420B for measurement $O_{A1}$, value 425B for measurement $O_{A2}$, and value 430B for measurement $O_{A3}$. Entry 480C includes value 410C for parameter A, value 415C for parameter B, value 420C for measurement $O_{A1}$, value 425C for measurement $O_{A2}$, and value 430B for measurement $O_{A3}$. Entry 480D includes value 410D for parameter A, value 415D for parameter B, value 420D for measurement $O_{A1}$, value 425D for measurement $O_{A2}$, and value 430D for measurement $O_{A3}$.

Table 495 includes four rows or entries 485A through 485D (destination entries). Each entry 485A through 485D includes a value for parameter A and B. Each entry 485A through 485D also includes fields for inputs $I_{B1}$, $I_{B2}$, and $I_{B3}$. The values for the inputs $I_{B1}$, $I_{B2}$, and $I_{B3}$ may be obtained from other testbenches (e.g., from table 490) by matching entries from the other testbenches to entries of table 495. In other embodiments, the values of the inputs $I_{B2}$, and $I_{B3}$ may be provided by the user or obtained from a different source (e.g., a database). Entry 485A includes value 440A for parameter A, value 445A for parameter B, field 450A for input $I_{B1}$, field 455A for input $I_{B2}$, and field 460A for input $I_{B3}$. Entry 485B includes value 440B for parameter A, value 445B for parameter B, field 450B for input $I_{B1}$, field 455B for input $I_{B2}$, and field 460B for input $I_{B3}$. Entry 485C includes value 440C for parameter A, value 445C for parameter B, field 450C for input $I_{B1}$, field 455C for input $I_{B2}$, and field 460C for input $I_{B3}$. Entry 485D includes value 440D for parameter A, value 445D for parameter B, field 450D for input $I_{B1}$, field 455D for input $I_{B2}$, and field 460D for input $I_{B3}$.

In the testing of destination block 320, entries from the testbench 490 of source block 310 are matched to entries from testbench 495 based on the value of parameters A and B. If an entry from testbench 490 matches an entry from testbench 495, the measurements corresponding to outputs $O_{A1}$ and $O_{A2}$ of the matching entry in testbench 490 are mapped to inputs $I_{B1}$ and $I_{B2}$ of the matching entry in testbench 490. That is, for example, if the value of cell 410B matches the value of cell 440D (corresponding to parameter A) and the value of cell 415B matches the value of cell 445D (corresponding to parameter B), then the value of cell 420B are mapped to cell 450D and the value of cell 425B is mapped to cell 455D. If multiple entries in testbench 490 map to an entry in testbench 495, the values of the measurements from the multiple matching entries may be aggregated based on a specific aggregation function. For example, if the value of cells 410A and 410C matches the value of cell 440A (corresponding to parameter A) and the value of cells 415A and 415C matched the value of cell 445A (corresponding to parameter B), then the values of cells 420A and 420C are aggregated together based on an aggregation function and the aggregated value is mapped to cell 450A. Similarly, the values of cells 425A and 425C are aggregated together and the aggregated value is mapped to cell 455A. The aggregation of multiple entries is described below in conjunction with FIGS. 6, 7A and 7B.

Figure 5:
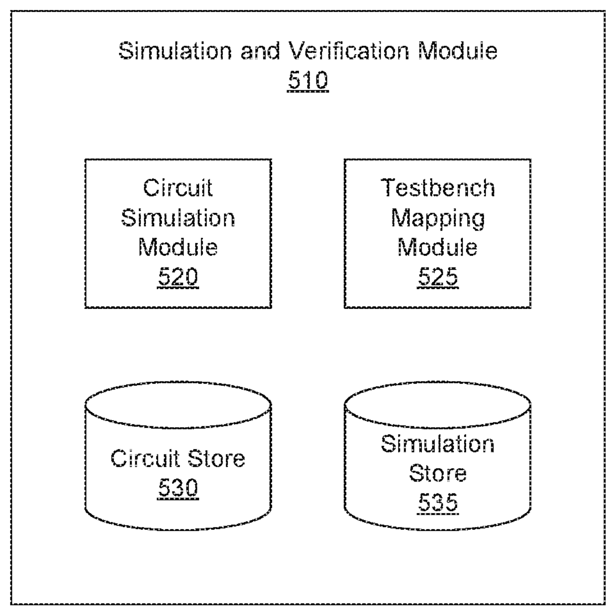
FIG. 5 illustrates a block diagram of a simulation and verification module, according to one embodiment.

FIG. 5 illustrates a block diagram of a simulation and verification module 510, according to one embodiment. The simulation and verification module 510 may include, among other components, a circuit simulation module 520, a testbench mapping module 525, a circuit store 530, and a simulation store 535. The circuit store stores 530 digital representations of one or more circuits. The digital representations of a circuit may, for example, be a circuit schematic, netlist or a hardware description language (HDL) representation of a circuit design.

The circuit simulation module 520 is a software module that simulates the operation of one or more circuits stored in the circuit store 530. The circuit simulation module 520 determines an output of a circuit for a set of stimuli. In some embodiments, the set of stimuli are specified by a user. In other embodiments, the set of stimuli may be obtained from a file or from a testbench stored in the simulation store 535. The set of stimuli may include an input voltage/current, a supply voltage, an amount of process variation, ambient temperature, etc. The circuit simulation module 520 may use different verification strategies to verify the operation of a circuit design. The different verification strategies include a parametric analysis, a Monte Carlo analysis, a corner analysis, or a combination thereof. In a parametric analysis, the circuit simulation module 520 sweeps one or more variables such as supply values, temperature values, load capacitance values, etc. A Monte Carlo analysis is a randomized sampling of the process variation space, following pre-specified distributions of the process parameter. The corner analysis is a simulation for a multi-dimensional grid of corner values (e.g., fast, slow, and typical values) of different parameters in the simulation model (e.g., process parameters, temperature parameters, load capacitance parameters, etc.).

The circuit simulation module 520 stores the results of a simulation in the simulation store 535. The simulation store 535 stores a testbench used to verify the operation of a circuit and the results of the simulation or verification of the circuit. The testbench includes the description of the stimuli provided to the circuit, and an identification of the outputs being stored. For instance, a testbench specifies a voltage value for the supply voltages VDD and VSS, a set temperature value (e.g., 300K), and a voltage sweep range (e.g., a start voltage of 0V, an end voltage of 10V, and a number of values of 10) for the input voltages. In some embodiments, the simulation store uses a relational database (e.g., MySQL, SQLite, or PostgreSQL). In other embodiments, other types of databases such as document-oriented databases may be used.

In some embodiments, the simulation database is stored remotely and shared by multiple users. Users designing blocks for a circuit or system may connect to the simulation database of the circuit or system and store the testbenches for testing their respective blocks and the results of the testing of the blocks.

The testbench mapping module 525 is a software module that provides data alignment between the data provided by performing the simulation of a source block 310 and the data to be provided for the simulation of a destination block 320. Data alignment may include matching an output of a source block 310 to an input of a destination block 320. The mapping may be a one-to-one mapping, i.e., mapping a single value for an output of the source block 310 to a single value for an input to be provided to the destination block 320; a many-to-one mapping, i.e., mapping a set of values for an output of the source block 310 to a single value for an input to be provided to the destination block 320; a one-to-many mapping, i.e., mapping a single value for an output of the source block 310 to one set of values for an input to be provided to the destination block 320; or a many-to-many mapping, i.e., mapping a set of values for an output of the source block 310 to a set of values for an input to be provided to the destination block 320. For example, a many-to-one mapping may map the multiple output voltages of a voltage sweep in the simulation of the source block 310, to a single value for an input voltage in the simulation of the destination block 320. In another example, a one-to-many mapping may map a single output voltage value in the simulation of the source block 310 performed at a temperature of 300K to a set of input voltages for a temperature sweep in the simulation of the destination block 320.

The testbench mapping module 525 uses an aggregation function to map values in the testbench of the source block 310 to a single value in the testbench of the destination block 320. For instance, the aggregation function for a many-to-one or a many-to-many mapping performs one of the following:

a) Choosing a minimum value of the set of values
b) Choosing a maximum value of the set of values
c) Choosing a mean value of the set of values
d) Choosing the mean value of the set of values plus/minus one standard deviation
e) Choosing the mean value of the set of values plus/minus a multiple number of standard deviations
f) Choosing the first value of the set of values
g) Choosing the last value of the set of values In some embodiments, the aggregation function may be specified by the user performing a simulation of a circuit block. The user defined aggregation functions takes as an input a set of values (e.g., an array of values) and returns a single value based on one or more of the inputted set of values. For instance, the user may provide an aggregation function that calculates the geometric mean of multiple values as a user defined aggregation function.

Figure 6:
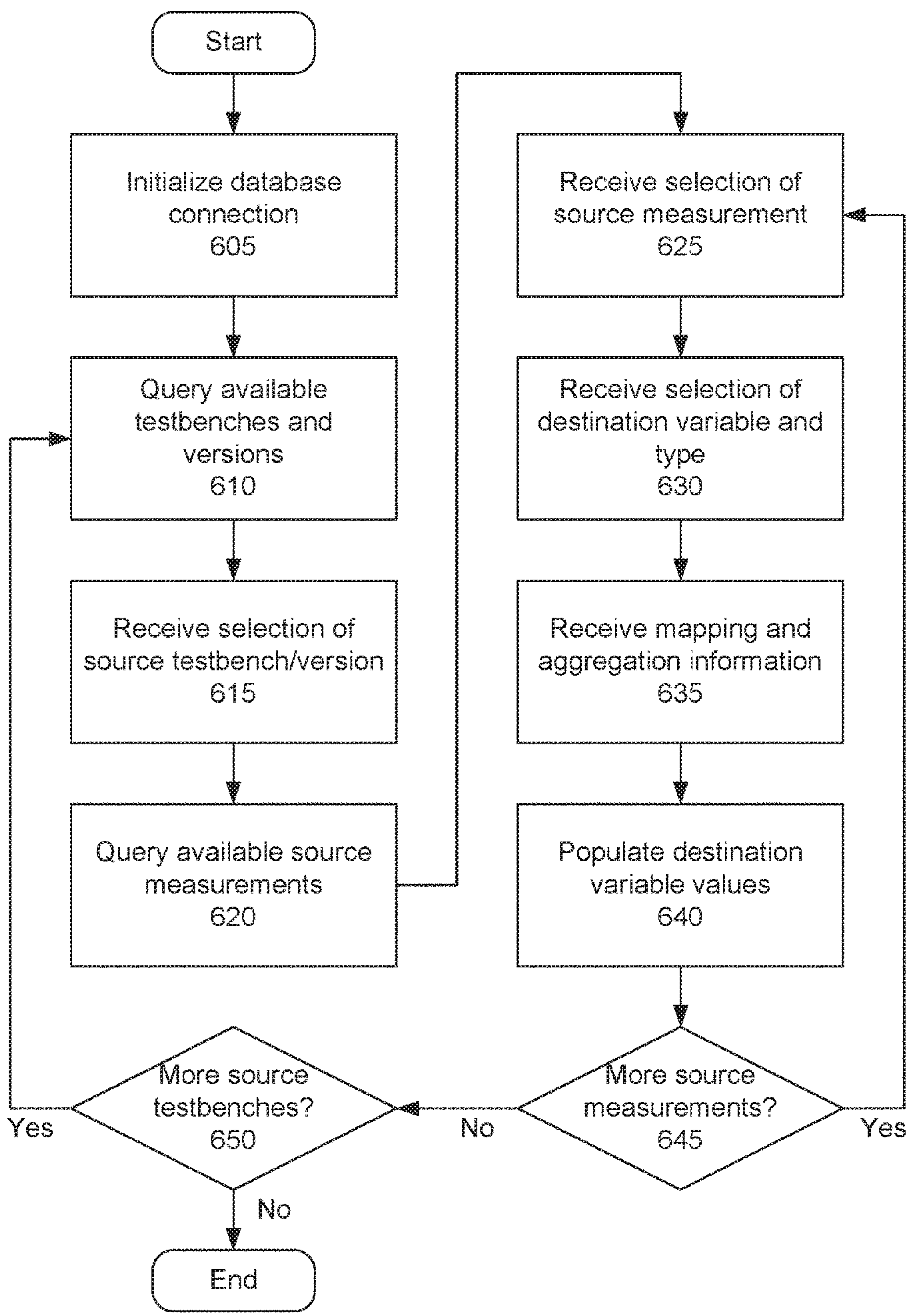
FIG. 6 illustrates a flow diagram of a process for chaining the testing of multiple circuit blocks, according to one embodiment.

FIG. 6 illustrates a flow diagram of a process for chaining the testing of multiple circuit blocks, according to one embodiment. The simulation and verification module 510 initializes 605 a connection to the different databases such as the circuit store 530 and the simulation store 535. In some embodiments, a user of the simulation and verification module 510 provides a user name and password for authenticating the user for access to the databases.

The simulation and verification module 510 queries 610 the simulation store 535 for available testbenches and versions available in the simulation store 535. The simulation and verification module 510 may then present the available testbenches to the user via a graphical user interface. The simulation and verification module 510 receives 615 a selection of a source testbench and version of the testbench from the available testbenches presented to the user. For instance, the user may select one of the available testbenches via dropdown box 810 and 815 of the graphical user interface of FIG. 8A.

The simulation and verification module 510 queries 620 the simulation store 535 for available measurements for the selected source testbench. As described herein, measurements are values for an output of a block that were determined by the circuit simulation module 520 and stored in the simulation store 535. The simulation and verification module 510 may then present the available measurements to the user via a graphical user interface. The simulation and verification module 510 receives 625 a selection of a source measurement. For instance, the user may select one of the available measurements via dropdown box 820 of the graphical user interface of FIG. 8A.

The simulation and verification module 510 receives 630 a selection of a destination variable and type. For instance, the user may select a destination variable type and name via dropdown boxes 830 and 835 respectively of the graphical user interface of FIG. 8A.

The simulation and verification module 510 receives 635 mapping and aggregation information from the user. In some embodiments, the mapping and aggregation information is retrieved from a file or may be automatically determined (e.g., using a default information) by the simulation and verification module 510. For instance, the mapping and aggregation information is received from the user via dropdown box 840 of graphical user interface of FIG. 8A. In some embodiments, the graphical user interface changes based on the source measurement and the destination variable. For example, if the source measurement includes multiple values (e.g., from a voltage sweep) and the destination variable has a single value (i.e., a many-to-one mapping), the graphical user interface may provide an interface element for selecting an aggregation function to aggregate the multiple values of the source measurement to a single value to be provided to the destination block. In another example, if the source measurement includes multiple values and the destination variable has multiple values (i.e., a many-to-many mapping), the graphical user interface may provide multiple interface elements for specifying the many-to-many mapping, such as, an interface element for providing an aggregation function to specify the start of a voltage sweep, an aggregation function to specify the end of the voltage sweep, and the number of steps in the voltage sweep.

The testbench mapping module 525 populates the destination values based on the values of the source measurements, and the mapping and aggregation information selected by the user. If there are more source measurements to consider, the process goes back to step 625. Otherwise, if there are no more source measurements to consider but there are more testbenches to consider, the process goes back to step 610. Finally, if there are no more source measurements or testbenches to consider, the process ends.

Figure 7A:
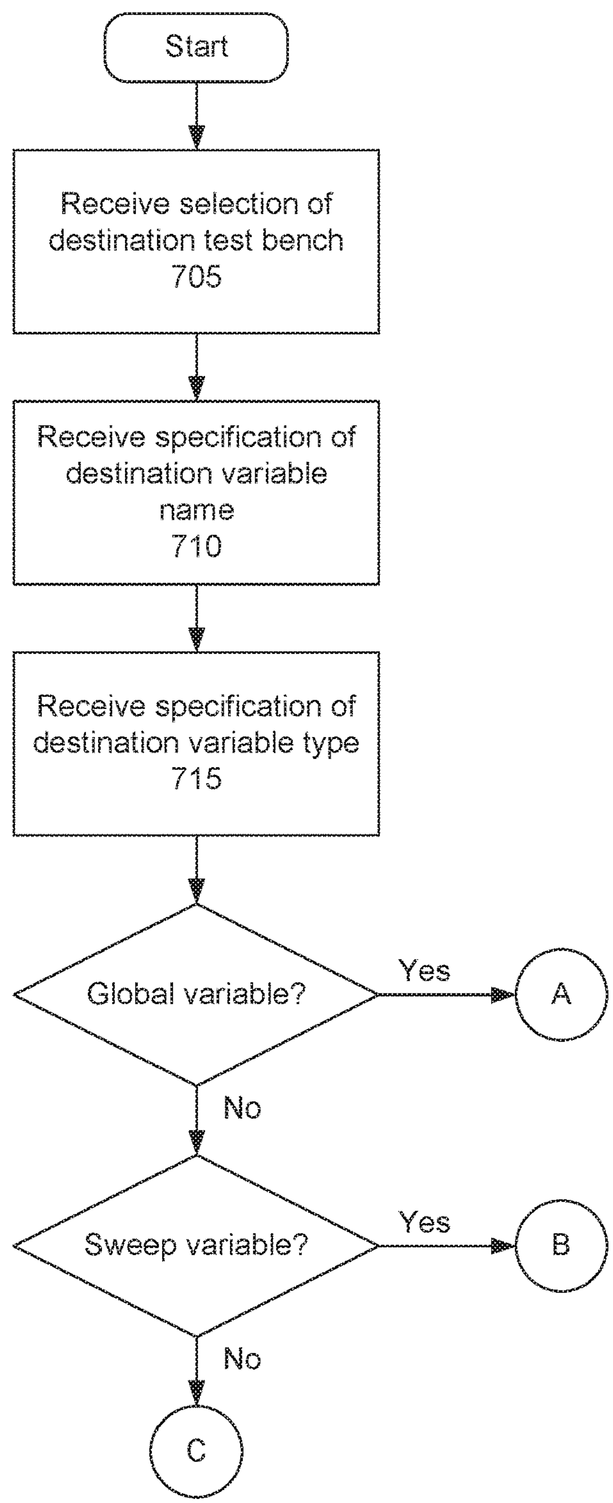
FIG. 7A and FIG. 7B illustrate a flow diagram of a process for mapping measurements of a source block to input values in a destination block, according to one embodiment.
Figure 7B:
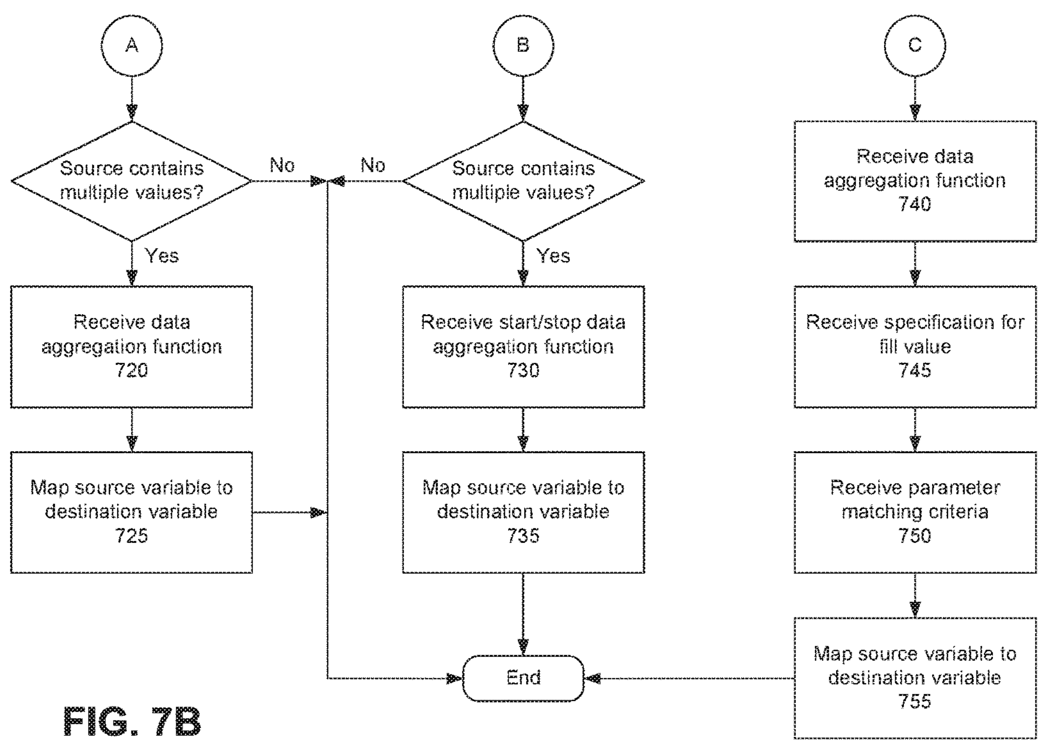

FIG. 7A and FIG. 7B illustrate a flow diagram of a process for mapping measurements of a source block to input values in a destination block, according to one embodiment. The simulation and verification module 510 receives 705 a selection of a destination testbench, receives 710 a specification of a destination variable name, and receives 715 a specification of a destination variable type.

The simulation and verification module 510 makes a determination whether the destination variable is a single-valued variable (i.e., a 'constant' variable). As used herein, a single-valued variable is a variable that takes a single value in a testbench. That is, the value of the single-valued variable does not change throughout the execution of the testbench. If the destination variable is a single-valued variable, the method proceeds to branch A illustrated in FIG. 7B. Otherwise, the simulation and verification module 510 makes a determination whether the destination variable is a sweep variable. If the destination variable is a sweep variable, the method proceeds to branch B illustrated in FIG. 7B. Otherwise, the method proceeds to branch C illustrated in FIG. 7B. As described herein, a sweep variable is a variable that is swept or varied through a range of values. In some embodiments, a sweep variable is defined by a start value, and end value and a number of steps. The actual sweep values are then determined by interpolating the start value and the end valued based on the identified number of steps.

If the destination variable is a single-valued variable, the simulation and verification module 510 determines whether the source measurement contains multiple values. That is, the simulation and verification module determines if the source testbench includes multiple source entries with values for a source measurement that can be mapped to the destination variable. In some embodiments, the simulation and verification module 510 determines whether a source entry can be mapped to the destination variable by comparing the parameters of the source entry with the parameters of one or more entries in the destination testbench (i.e., one or more destination entries). If the source measurements contain a single value, the method selects that single value and the method ends. Otherwise, if the source measurements contain multiple values, the simulation and verification module 510 receives 720 an aggregation function. The testbench mapping module 525 maps 725 the source measurements to the single destination variable based on the received aggregation function.

If the destination variable is a sweep variable, the simulation and verification module 510 determines whether the source measurements contain multiple values. That is, the simulation and verification module determines if the source testbench includes multiple source entries with values for a source measurement that can be mapped to the destination variable. In some embodiments, the simulation and verification module 510 determines whether a source entry can be mapped to the destination variable by comparing the parameters of the source entry with the parameters of one or more entries in the destination testbench (i.e., one or more destination entries). If the source measurements contain a single value, the method ends. Otherwise, if the source measurements contain multiple values, the simulation and verification module 510 receives 730 an aggregation function for the start and stop values of the sweep. In some embodiments, the same aggregation function is used for the start and stop values of the sweep. In other embodiments, a different aggregation function may be specified for the start and stop values of the sweep. In some embodiments, a number of steps for the sweep is also received from the user. For instance the aggregation function for the start value of the sweep may be selected via dropdown box 850 of the graphical user interface of FIG. 8A, the aggregation function for the end value of the sweep may be selected via dropdown box 855 of the graphical user interface of FIG. 8A, and the number of steps for the sweep may be selected via dropdown box 860 of the graphical user interface of FIG. 8A. The testbench mapping module 525 maps 735 the source measurements to the destination variables based on the received aggregation function.

For example, a user may want to perform a simulation where the supply voltage VDD is swept from 0.5V to 1.0V. The source block may include multiple output values for different values of supply voltage VDD. For instance, the source block may include output values for a sweep of the supply voltage and different values of load capacitance. The testbench mapping module 525 may identify the output values for a specific supply voltage level (e.g., 0.5V) and aggregate the multiple identified output values based on the specified aggregation function. In some embodiments, if a specific value is not available in the source measurements (e.g., a specific supply voltage level was not simulated for the source block), the aggregated source measurements may be interpolated or extrapolated to obtain the missing source measurement. For example, if a user would like to perform a simulation for a supply voltage of 1V but the source measurements only include measurements when the supply voltage is 0.5V and 1.5V, the source measurement corresponding to when the supply voltage is 1V may be obtained by interpolating the source measurements for when the supply voltage is 0.5V and 1.5V.

If the destination variable is not a single-valued variable or a sweep variable, the simulation and verification module 510 receives 740 an aggregation function. In some embodiments, if the destination variable is not a single-valued variable or a sweep variable, the destination variable is then a corner variable. As described herein, a corner variable represents a Simulation Program with Integrated Circuit Emphasis (SPICE) model corner. Additionally, the simulation and verification module 510 receives 745 a fill value for measurements that are not available in the source measurements. As used herein, a fill value is a value that may be used when a match could not be found in the source measurements. In some embodiments, the fill value is received from the user. In other embodiments, the fill value is retrieved from a file or is automatically determined (e.g., by selecting a default value) by the simulation and verification module 510. For instance, the user may select a fill value via textbox 875 of the graphical user interface of FIG. 8C.

The simulation and verification module 510 also receives 750 a parameter matching criteria. For instance, the matching criteria may specify a tolerance factor (e.g., a percentage tolerance) that can be used when comparing parameter values for matching purposes. In some embodiments, the tolerance factor is specified as a single global option. In other embodiments, the tolerance factor can be specified on a per-parameter basis. In some embodiments, the user may specify to ignore one or more parameters if a match for those one or more parameters cannot be found. For instance, the user may specify the parameter matching criteria via user interface element 880 of the graphical user interface of FIG. 8C.

An example testbench for a source block is provided below:

TABLE I

Example testbench for a source block

| Corner | Ttnmos | diode | output cap | temperature | vout |
|---|---|---|---|---|---|
| C1 | TT | TT | 1.2 p | −40 | 1.2532 |
| C2 | FF | FF | 2.3 p | 150 | 1.2482 |
| C3 | SS | SS | 1.9 p | −40 | 1.2461 |
| C4 | SS | FF | 3.2 p | 150 | 1.2381 |

Furthermore, the testbench for the destination block may include an entry for the scenario where Ttnmos has a value of TT, diode has a value of TT, and the output capacitance has a value of 1.9p. This will result as a no-match since the testbench for the source block does not include an entry where Ttnmos has a value of TT, diode has a value of TT, and the output capacitance has a value of 1.9p. In this case, the testbench mapping module 525 may determine whether the user has specified an ignore criteria. For example, the testbench mapping module 525 determines that the user specified the parameter "output cap" to be ignored if a match is not found. In this case, the testbench mapping module 525 search the testbench for the source block again and identifies corner C1 as a match since in corner C1 Ttnmos has a value of TT and diode has a value of TT.

The simulation and verification module 510 may also receive a name-mapping parameter that maps a parameter in a testbench of a source block to a parameter in a testbench of a destination block. For instance, the name-mapping parameter may specify to match the parameter named "Temp" in the testbench of the source block to the parameter named "temperature" in the testbench of the destination block.

Figure 8C:
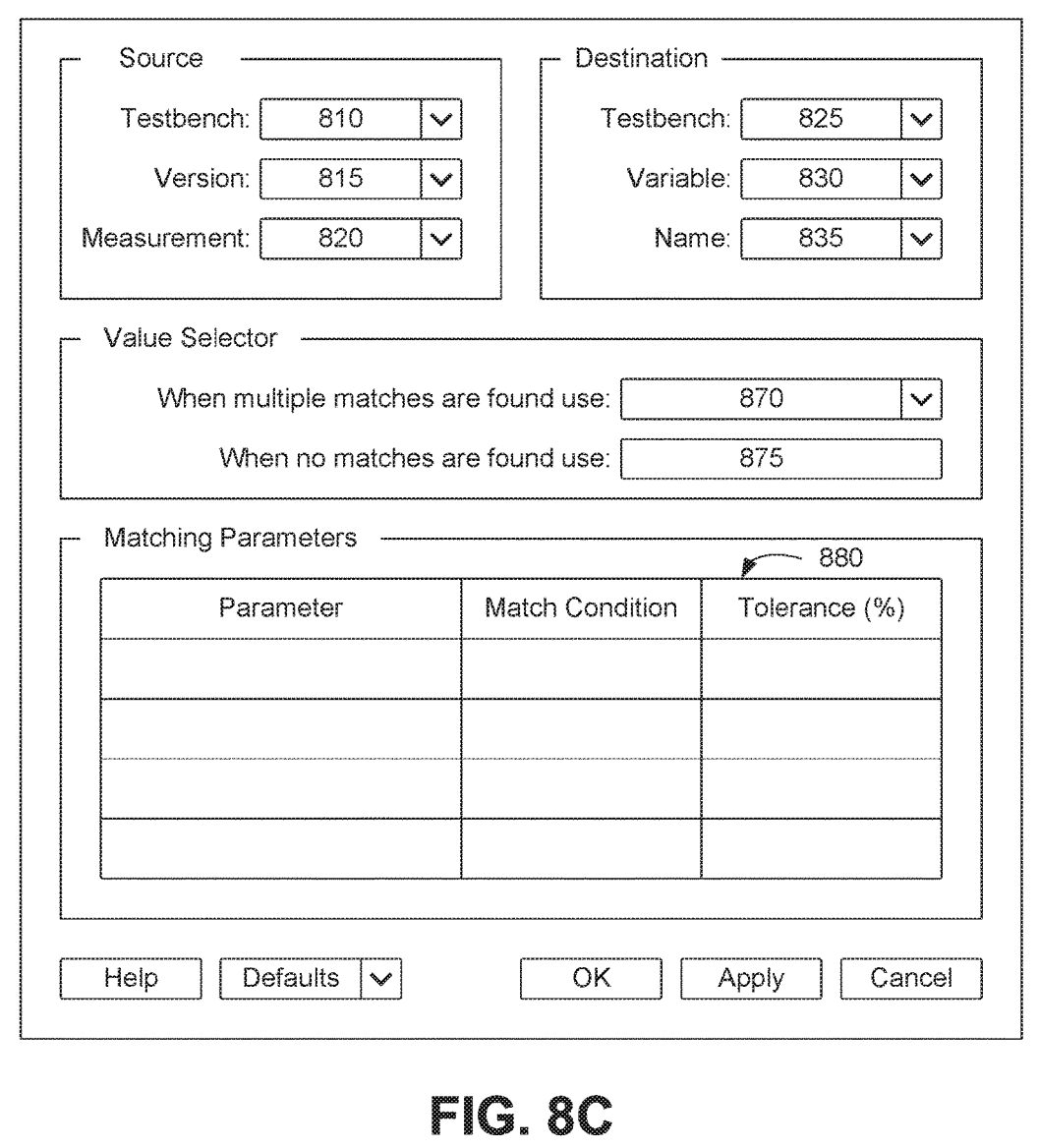

FIGS. 8A, 8B, and 8C illustrate graphical user interfaces for configuring the source and destination testbench mapping, according to one embodiment. The user interfaces include graphical user interface elements for specifying a source testbench (e.g., dropdown box 810), a source testbench version (e.g., dropdown box 815), and a source measurement (e.g., dropdown box 820). The user interface also includes graphical user interface elements for specifying a destination testbench (e.g., dropdown box 825), a destination variable type (e.g., dropdown box 830), and a destination variable name (e.g., dropdown box X35).

The graphical user interface further includes a section for specifying one or more aggregation functions. In some embodiments, the section for specifying the aggregation functions dynamically changes based on properties of the selected source testbench and the destination variable type. For instance, the graphical user interface of FIG. 8A includes a single dropdown box 840 for aggregating multiple source measurements into a single destination variable value. The graphical user interface of FIG. 8B includes user interface elements 850 and 855 for specifying aggregation functions to map multiple source measurement values to a variable sweep in the destination testbench.

Moreover, the graphical user interface may include a section for specifying parameter matching criteria. For instance, the graphical user interface of FIG. 8C includes a table 880 for inputting one or more parameter matching criteria. Table 880 allows users to specify a source parameter, a matching condition, and a tolerance value. In some embodiments, the match condition may be an 'exact match,' an 'approximate match,' or 'ignore.' An 'exact match' for a parameter indicates that two entries match if the values of the parameter are the same in both entries. This is particularly useful for integer values. An 'approximate match' of a parameter indicates that two entries match if the values of the parameter in both entries are within a specified threshold value. An 'ignore' condition for a parameter indicates that that parameter is not compared when determining whether two entries match. That is, two entries may still be a match even if the values of the parameter are different.

While particular embodiments and applications have been illustrated and described, it is to be understood that the disclosed embodiments are not limited to the precise construction and components disclosed herein. Various modifications, changes and variations, which will be apparent to those skilled in the art, may be made in the arrangement, operation and details of the method and apparatus disclosed herein without departing from the spirit and scope defined in the appended claims.

What is claimed is:

1. A method comprising:

receiving a selection of a source testbench, the source testbench including:

a description of one or more source parameters for testing of a source circuit block, a description of one or more source measurements from the testing of the source circuit block, and a plurality of source entries, each of the source entries including a value for each of the one or more source parameters and each of the one or more source measurements;

receiving a selection of a destination testbench, the destination testbench including:

a description of one or more destination parameters, and a plurality of destination entries including a value for each of the one or more destination parameters;

matching one or more source entries from the plurality of source entries with a destination entry from the plurality of destination entries, the matching performed by comparing:

the value of the one or more source parameters of each of the source entries, and the value of the one or more destination parameters of each of the destination entries;

aggregating the value of one or more of the source measurements of the matched one or more source entries using an aggregation function to obtain one or more aggregated source measurement values; and mapping the one or more aggregated source measurement values to the matched destination entry.

2. The method of claim 1:

wherein aggregating one or more of the source measurements comprises:

receiving an identification of a source measurement from the one or more source measurements, receiving a specification of a destination variable, the specification of the destination variable including a variable name and a variable type; and responsive to the variable type being a sweep variable:

receiving a first aggregation function for a start of the sweep, receiving a second aggregation function for an end of the sweep, determining a start value by aggregating the identified source measurement of the matched one or more source entries based on the first aggregation function, and determining an end value by aggregating the identified source measurement of the matched one or more source entries based on the second aggregation function; and wherein mapping the one or more aggregated source measurement values comprises:

generating a plurality of variable values by interpolating the start value and the end value, and mapping each of the generated plurality of variable values to a destination entity of the plurality of destination entries.

3. A method comprising:

matching one or more source entries from a plurality of source entries of a source testbench with a destination entry from a plurality of destination entries of a destination testbench, the matching performed by comparing:

a value of one or more source parameters of each of the plurality of source entries, and a value of one or more destination parameters of each of the plurality of destination entries;

aggregating the value of one or more of the source measurements of the matched one or more source entries using an aggregation function to obtain one or more aggregated source measurement values; and mapping the one or more aggregated source measurement values to the matched destination entry.

4. The method of claim 3, further comprising:

receiving a selection of the source testbench, the source testbench including:

a description of one or more source parameters for testing of a source circuit block, a description of one or more source measurements from the testing of the source circuit block, and a plurality of source entries, each of the source entries including a value for each of the one or more source parameters and each of the one or more source measurements.

5. The method of claim 3, further comprising:

receiving a selection of a destination testbench, the destination testbench including:

a description of one or more destination parameters; and a plurality of destination entries including a value for each of the one or more destination parameters.

6. The method of claim 3, wherein aggregating the one or more of the source measurements comprises:

receiving a specification of a destination variable, the specification of the destination variable including a variable name and a variable type; and responsive to the variable type being a sweep variable, the sweep variable varying through a range of values:

determining a start value by aggregating the identified source measurement of the matched one or more source entries using a first aggregation function, and determining an end value by aggregating the identified source measurement of the matched one or more source entries using a second aggregation function.

7. The method of claim 6, further comprising:

responsive to the variable type being the sweep variable:

receiving, from a user, the first aggregation function for a start of the sweep, and receiving, from a user, the second aggregation function for an end of the sweep.

8. The method of claim 6, wherein mapping the one or more aggregated source measurement values comprises:

generating a plurality of variable values by interpolating the start value and the end value; and mapping each of the generated plurality of variable values to a destination entity of the plurality of destination entries.

9. The method of claim 3, wherein aggregating one or more of the source measurements comprises:

receiving a specification of a destination variable, the specification of the destination variable including a variable name and a variable type; and responsive to the variable type being a single-valued variable, the single-valued variable having a same value in each of the destination entries:

determining a variable value by aggregating the identified source measurement of the matched one or more source entries using the aggregation function.

10. The method of claim 9, wherein mapping the one or more aggregated source measurement values comprises:

mapping the determined variable value to the destination variable.

11. The method of claim 3, wherein aggregating one or more of the source measurements comprises:

receiving a specification of a destination variable, the specification of the destination variable including a variable name and a variable type; and responsive to the variable type being a corner variable, the corner variable representing a Simulation Program with Integrated Circuit Emphasis (SPICE) model corner:

receiving a specification for a parameter matching criteria, and for each of the destination entries:

identifying source entries that match with the destination entry based on the matching criteria, and determining a variable value by aggregating the value of one or more of the source measurements of the identified source entries based on the aggregation function.

12. The method of claim 3, wherein mapping the one or more aggregated source measurement values comprises:

mapping the determined variable value to the matched destination entry.

13. The method of claim 3, wherein the aggregation function performs one of:

choosing a minimum value from a set of values, choosing a maximum value from the set of values, choosing a mean value of the set of values, choosing the mean value of the set of values plus one standard deviation, choosing the mean value of the set of values minus one standard deviation, choosing the mean value of the set of values plus a multiple number of standard deviations, choosing the mean value of the set of values minus a multiple number of standard deviations, choosing a first value of the set of values, or choosing a last value of the set of values.

14. The method of claim 3, wherein the aggregation function is a user defined function.

15. The method of claim 3, further comprising:

providing a dynamic user interface, the dynamic user interface allowing a user to select the source testbench and the destination testbench, wherein the dynamic user interface changes based on the selected the source testbench and the selected destination testbench.

16. The method of claim 3, wherein the one or more source parameters are at least one of:

a supply voltage parameter, a temperature parameter, a process variation parameter, and a load capacitance parameter.

17. The method of claim 3, further comprising:

receiving a matching criteria for a parameter of the one or more destination parameters, the matching criteria selected from a list consisting of an exact match, an approximate match, and an ignore criteria; and wherein matching one or more source entries from a plurality of source entries of a source testbench with a destination entry from a plurality of destination entries of a destination testbench is further based on the received matching criteria.

18. A non-transitory computer readable storage medium storing instructions, the instruction when executed by a processor cause the processor to:

match one or more source entries from a plurality of source entries of a source testbench with a destination entry from a plurality of destination entries of a destination testbench, the matching performed by comparing:

a value of one or more source parameters of each of the plurality of source entries, and a value of one or more destination parameters of each of the plurality of destination entries;

aggregate the value of one or more of the source measurements of the matched one or more source entries using an aggregation function to obtain one or more aggregated source measurement values; and map the one or more aggregated source measurement values to the matched destination entry.

19. The non-transitory computer readable storage medium of claim 18, wherein the instructions for aggregating the one or more of the source measurements cause the processor to:

receive a specification of a destination variable, the specification of the destination variable including a variable name and a variable type, and responsive to the variable type being a sweep variable, the sweep variable varying through a range of values:

determine a start value by aggregating the identified source measurement of the matched one or more source entries using a first aggregation function, and determine an end value by aggregating the identified source measurement of the matched one or more source entries using a second aggregation function; and wherein the instruction for mapping the one or more aggregated source measurement values cause the processor to:

generate a plurality of variable values by interpolating the start value and the end value, and map each of the generated plurality of variable values to a destination entity of the plurality of destination entries.

20. The non-transitory computer readable storage medium of claim 18, wherein the instructions for aggregating the one or more of the source measurements cause the processor to:

receiving a specification of a destination variable, the specification of the destination variable including a variable name and a variable type, and responsive to the variable type being a single-valued variable, the single-valued variable having a same value in each of the destination entries:

determining a variable value by aggregating the identified source measurement of the matched one or more source entries using the aggregation function; and wherein the instruction for mapping the one or more aggregated source measurement values cause the processor to:

map the determined variable value to the destination variable.

* * * * *